United States Patent
Lo et al.

[11] Patent Number: 5,973,441
[45] Date of Patent: Oct. 26, 1999

[54] PIEZOCERAMIC VIBROTACTILE TRANSDUCER BASED ON PRE-COMPRESSED ARCH

[75] Inventors: K. Peter Lo; Nicholas V. Nechitailo; Howard J. Moses, all of Blacksburg; Lawrence H. Decker, Christiansburg, all of Va.; Howard P. Groger, Gainesville, Fla.; Russell J. Churchill, Radford, Va.

[73] Assignee: American Research Corporation of Virginia, Radford, Va.

[21] Appl. No.: 08/856,681

[22] Filed: May 15, 1997

Related U.S. Application Data

[60] Provisional application No. 60/017,788, May 15, 1996.

[51] Int. Cl.⁶ .................................................. H01L 41/08
[52] U.S. Cl. ........................ 310/330; 310/331; 310/353
[58] Field of Search ......................... 310/330, 331, 310/345, 348, 353, 354

[56] References Cited

U.S. PATENT DOCUMENTS

| | | | |
|---|---|---|---|
| 3,076,903 | 2/1963 | Schwartz | 310/348 |
| 3,115,588 | 12/1963 | Hueter | 310/330 |
| 3,792,204 | 2/1974 | Murayama et al. | 179/110 A |
| 3,816,774 | 6/1974 | Ohnuki et al. | 310/330 |
| 4,088,915 | 5/1978 | Kodama | 310/334 |
| 4,245,138 | 1/1981 | Harper | 200/5 A |
| 4,276,491 | 6/1981 | Daniel | 310/317 |
| 4,383,195 | 5/1983 | Kolm et al. | 310/330 |
| 4,471,258 | 9/1984 | Kumada | 310/345 |
| 4,739,211 | 4/1988 | Strachan | 310/321 |
| 5,229,744 | 7/1993 | Ogura | 310/324 |
| 5,389,849 | 2/1995 | Asano et al. | 310/323 |
| 5,469,133 | 11/1995 | Hensler et al. | 340/407.1 |
| 5,471,721 | 12/1995 | Haertling | 310/363 |
| 5,488,351 | 1/1996 | Hedayatnia et al. | 340/407.1 |
| 5,495,137 | 2/1996 | Park et al. | 310/331 |
| 5,589,725 | 12/1996 | Haertling | 310/358 |
| 5,767,612 | 6/1998 | Takeuchi et al. | 310/324 |
| 5,780,958 | 7/1998 | Strugach et al. | 310/348 |

OTHER PUBLICATIONS

"Piezoceramic Actuator Offers High Displacement", Medical Equipment Designer, (1994).

NASA Technology Note, "Thunder—The High–Displacement Piezoelectric Actuator for the Pump Industry".

*Primary Examiner*—Thomas M. Dougherty
*Attorney, Agent, or Firm*—James Creighton Wray; Meera P. Narasimhan

[57] ABSTRACT

The vibration and electrical characterization of a piezoelectric tactor actuator is described. The actuator is a rectangular laminated flat plate with two opposite sides simply supported and two others free. Under an axial compression from the supports, the plate deforms into a stressed shallow shell. Electrical high frequency harmonic signals within relatively low-frequency bursts are applied to the piezoelectric layers. Depending on the axial compression and pre-deflection, frequency and magnitude of electrical input, the tunable actuator exhibits frequency/mode-controlled high-force over large area vibrations with intense displacement jumps. A single-degree-of-freedom model and simplified 1-D models are provided. The tactor provides efficient conversion of electrical energy into mechanical.

16 Claims, 17 Drawing Sheets

Driving force G(t) sin 360 t:
G(t) = 1.  for  t < 0.15
G(t) = 0  for  t ≥ 0.15

Displacement jump:
g(t) = 1.3  for  0.03 ≤ t ≤ 0.15
g(t) = 0  for  t < 0.03
g(t) = 0  for  t > 0.15

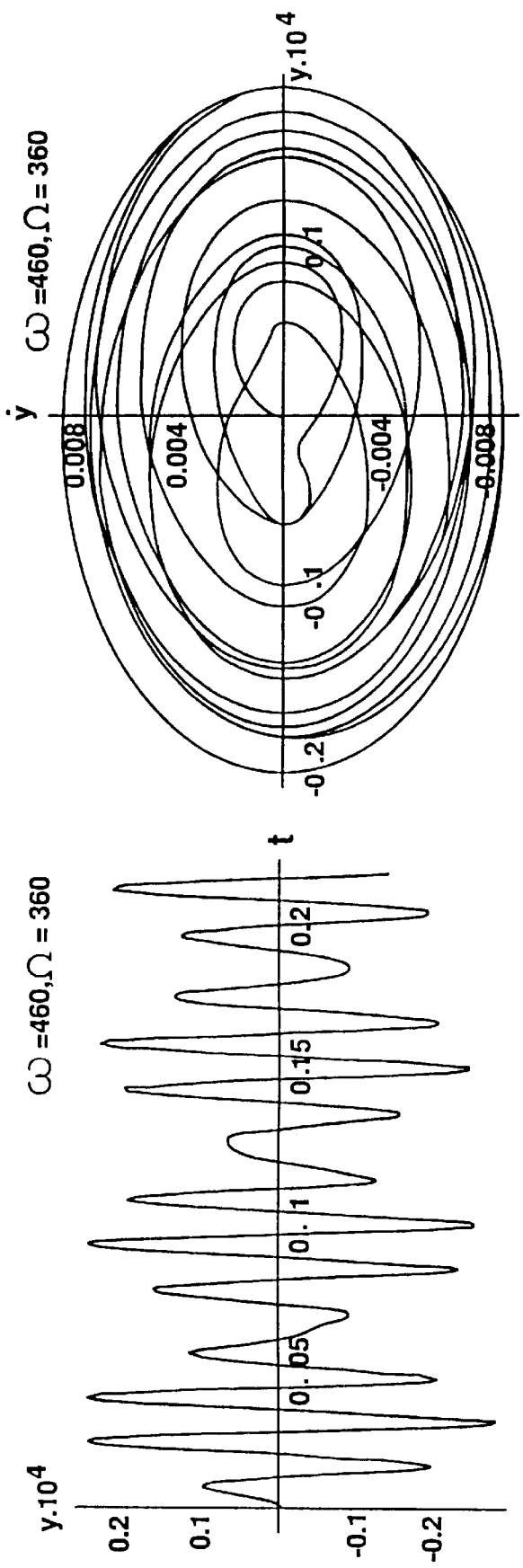

Palm Tactor and Electronic Amplifier.

Belt Tactor Worn on Test User Waist.

# 5,973,441

PIEZOCERAMIC VIBROTACTILE TRANSDUCER BASED ON PRE-COMPRESSED ARCH

This application claims benefit of Provisional Application Ser. No. 60/017,788 filed May 5, 1996.

BACKGROUND OF THE INVENTION

The present invention addresses the problem of creating an effective actuator to provide tactile feedback to an individual in a high workload environment. Such an environment is represented by flight conditions which could cause spatial disorientation to a pilot, underwater navigation for a SEAL diver, or EVA missions for a space walker. In each situation, the opportunity to communicate by using the sense of feel opens an underutilized message path in addition to the conventional visual and aural techniques. The present invention relates generally to apparatus for providing tactile sensation to a user.

The complexity of the military environment places great physical and mental stress on soldiers involved in performing complex tasks. For example, aircraft pilots report that flying in conditions of poor visibility or at night can lead to spatial disorientation which may, in turn, lead to the necessity for intervention to preserve the aircraft (NAVATHE and SINGHE, 1994). RUPERT et al. (1989) and CLARK and RUPERT (1992) reviewed surveys on aircraft accidents and determined that nearly 4 to 10% of Class A mishaps ($500,000 damage or loss of life) and 10 to 20% of the fatal aircraft mishaps were a result of inadequate spatial awareness. Similar situations are found in underwater diving under conditions of poor visibility or in battlefield situations requiring attention to a large battery of sensor information.

Aircraft safety is a major concern for both the public and private sectors of the aeronautical industry. Audio contact, even if initially available, is often lost in emergency situations. Conditions which arise during emergencies, such as dense smoke, render visual cues useless. Needs exist for apparatus that allow pilots and other aircraft personnel to receive information and instructions when visual and audible aids are not available.

In environments where audio and visual information channels would only compete with data necessary for optimal performance of complex military tasks, tactile sensations can be valuable in providing an additional information channel. Tactile sensations can be used to improve the situational awareness of military personnel and to guide military personnel in the performance of tasks requiring input from external sensors and control systems. Work performed at the Naval Aerospace Medical Research Laboratory (NAMRL), National Aeronautics and Space Administration, and University of West Florida has demonstrated that orientation awareness can be maintained through tactile cues (RUPERT et al., 1994). Successful development of tactile interfaces to improve situational awareness requires the availability of actuators capable of providing tactile stimuli representative of the operational situation. These actuators have been termed "tactors".

A wide range of actuators have been suggested for use as tactors in improving situational awareness. These include actuators based on piezoceramic structures, linear motors, shape memory alloy materials, magnetic materials, magnetostrictive materials and variable reluctance devices. The specifications for these tactors are as variable as the operational environments for expected use but include capability to generate tactile signals of sufficient magnitude; small size; low energy consumption; low hazard of electrical shock; quiet operation for use in undersea operations; controllable signal duration, intensity and frequency to allow use by individuals having a range of tactile and discomfort thresholds.

The impetus for the use of tactile stimulation to convey information about the environment may be traced to efforts at sensory substitution in providing a tactile channel for individuals with visual or auditory impairment (BLISS et al., 1970, WEISENBERGER and RUSSELL, 1989). More recently, tactile devices have been of great interest in the development of virtual reality displays for telerobotics, remote control and simulation (DE ROSSI, 1991, BROOKS et al., 1990). The physiological basis of tactile stimulation in producing a haptic display has been reviewed by CHOLEWIAK and COLLINS (1991). Tactile sensations may be perceived by free (bare) nerve endings or by nerve endings associated with or encapsulated within accessory structures. The current state of knowledge about these receptor structures is somewhat inconclusive in identifying the specific interactions responsible for the perception of tactile stimuli, but considerable effort has been expended to understand the action and characteristics of receptors in haptic perception. The encapsulated tactile receptors include the Pacinian corpuscles, Merkel's disks, Ruffini cylinders and Meissner's corpuscles. Each of the encapsulated tactile receptors is different from the others from an anatomical standpoint with resulting differences in response.

The Pacinian corpuscles respond to vibrations with displacements as small as 0.2 $\mu$m at a frequency of 250 Hz. The threshold increases for vibratory stimuli outside of the optimal frequency range. Increase in the size of the contactor decreases the threshold through an effect known as spatial summation. Non-Pacinian receptors have not been thought to exhibit spatial summation. The characteristics of probable tactile receptors are given in Table I.

The use of vibrotactile displays for sensory substitution systems has been reviewed by KACZMAREK et al.,(1 99 1) who presented a discussion of the information capacity of the tactile channel. The tactile information system may be said to possess some 10,000 parallel channels (receptors) capable of responding to stimuli as short as 10 ms, thereby providing considerable informational capacity if properly addressed. The information bandwidth of the tactile channel may vary widely among individuals. It is well known that vibrotactile stimulation thresholds vary considerably among individuals and with age. Considerable research expended toward determining the vibrotactile threshold has been reviewed by MAEDA and GRIFFIN (1994). Additional considerations in the application of tactile stimuli to improve situational awareness may be drawn from research by POST et al., (1994) who showed that the subjective intensity of suprathreshold tactile stimuli is considerably reduced during motor activity. For this reason, it is expected that higher amplitude tactile signals will be necessary to convey information to individuals engaged in active motor tasks.

The use of piezoelectric materials in actuators is reviewed by DAMJANOVIC and NEWNHAM (1992) and by NEWNHAM and RUSCHAU (1991). Typically piezo-materials displace less than 1 $\mu$m under an applied electric field. To increase the displacements, several designs have been introduced in the literature such as stacks, unimorph, bimorph, and Rainbow™ (ELISSALDE and CROSS, 1995). Piezoelectric multilayer stacks can be fabricated by joining multiple piezoelectric rings or plates, such that the total displacement of the stack is the sum of the displacements of each individual plate. Adjacent plates are separated by inner electrodes to provide vertical displacement through the piezoelectric charge coefficients. Several hundred plates are necessary to provide total displacements on the order of 20 µm (LUBITZ and HELLEBRAND, 1991).

The standard unimorph is made up of a flat piezoelectric wafer bonded to a metallic shim from one side. To increase the displacement range, the bimorph structures utilize PZT layers attached to both surfaces. The unimorph and bimorph structures usually utilize the geometry of a cantilever beam. In the bimorph, the application of an electric field across the two outer layers causes one layer to expand while the other contracts. This results in a bending motion with relatively wide displacements at the tip of the cantilever beam. In a cantilever configuration, the displacement of the tip, y, is related to the length of the cantilever, L, the applied voltage, V, and the thickness of the cantilever, h:

$$y = 2L^2 \, Vd_{31}/h^2,$$

where $d_{31}$ is the piezoelectric charge coefficient showing the magnitude of the strain induced in the direction of the cantilever when electrodes are applied perpendicular to the long axis of the cantilever. The magnitude of $d_{31}$ is typically less than $300 \times 10^{-12}$ V/m Cantilever-based piezoelectric actuators require lengths on the order of 25 mm or more to achieve a free deflection of 0.3 mm. Further increase in the displacement range may require utilizing resonance regimes.

Structurally similar to piezoelectric unimorphs, Rainbow™ high displacement domed buckling actuators produce displacements approximately 10 times greater than bimorphs ("Medical Equipment and Design," 1994). They support moderate loads up to 9 kg while achieving large displacements of between 0.025 and 1.27 mm, however, with a relatively high voltage range of 100–500 volts.

At present, no single tactile actuator has shown the capability of meeting each of these requirements. To address this problem, American Research Corporation of Virginia (ARCOVA) has developed piezoceramic vibrotactile transducers capable of conveying tactile information to the user through layers of clothing. The overall goal of was to design and develop new vibrotactile transducers capable of safely producing adequate skin and surrounding tissue stimulus at low energy consumption.

SUMMARY OF THE INVENTION

The key to an effective means of communicating tactile feedback is the actuator (tactor). The present approach is to create a mild thumping sensation on the skin by utilizing PZT material in a unique vibratory mode. The frequency and intensity of the sensation may be varied commensurate with the degree of danger or the desired action. Tactors may also be closely grouped to create an enhanced effect through sensory summation.

The present invention is a transducer apparatus for exciting small areas of a person's skin. The apparatus employs a phenomenon that involves the "buckling" of a pre-compressed, arch shaped plate. Use of the buckling phenomenon allows the present invention to increase the energy transferred from an actuator element to a user. By cycling the present apparatus in an on/off manner, coded information is provided to the user. The present invention has a wide variety of applications, including, but not limited to, commercial and military applications where audio and visual information is not readily transmittable, including many diving, aviation and transportation operations.

ARCOVA designed, fabricated and tested several novel versions of the PZT tactor. These unique designs utilize pre-compressed, pre-deflected piezoceramic transducers to increase energy transferred from the tactor elements to the user. The final configurations were integrated into a waist worn belt (6 tactors) and a palm/elbow test box (1 tactor). Suitable power and control circuitry were also designed and fabricated.

The PZT based vibratory design was proven to be small, reliable, and highly effective in penetrating layers of clothing to generate a skin sensation. The signals were clearly identifiable and their position, intensity, and frequency easily recognized.

The ARCOVA efforts are significant because they prove the feasibility of providing critical safety/mission/threat information in a complex workload environment through tactile feedback. Further, clear directions are provided as to fielding a practical system through refinements in the tactor size, voltage level, and analysis of the enhanced vibratory modes. Such a system is readily deployed in numerous situations to improve personnel safety and increase mission success.

Elastic piezoceramic elements have received extensive attention because of their capability of performing both actuator and sensor functions, as components of transducers (speakers, microphones, hydrophones), pumps, relays and switches, adaptive optics (variable-focus lens and mirrors), vibrators and ultrasonic cleaners, sensors (motion, stress, pressure, optical and pyroelectric), dynamic displacement and strain gages, amplifiers and accelerometers, benders and fans, actuators, positioners and robotic handlers, and printer hammers. The most common piezoelectric ceramics are lead zirconate titanate (PZT), barium titanate, lead titanate, lead metaniobate and zinc oxide. Piezoelectric materials are characterized by the development of a change in molecular polarization in response to an externally applied mechanical stress. The converse piezoelectric effect results in the deformation of the ceramic under the influence of an applied electric field. For a material to exhibit the converse piezoelectric effect, there must be a permanent separation of positive and negative charge centers at the unit cell level. An applied electric field exerts opposite forces on the positive and negative charge centers of the unit cell, causing deformation of the unit cell. The maximum strain induced by piezoelectric effects is on the order of 0.01% to 0.1% at applied electric fields of $10^6$ V/M.

Shallow arch structures subjected to external transverse pressure under certain conditions become unstable and exhibit a phenomenon called snap-buckling. This instability involves a sudden transition of the structure from one state of equilibrium to another non-adjoining stable equilibrium configuration. In the case of dynamic loading, the stability investigation requires the determination of the dynamic response of the structure as described by non-linear equations of motion. Buckling and collapse, as well as chaotic transitions from one position of equilibrium to another, are associated with very fast changes in the geometry of structures. These phenomenon serve as a background to design a large displacement and high velocity vibro-impacting PZT tactor providing significant stimulation to the skin over a relatively large area.

The ARCOVA design approach is based upon utilizing the most efficient buckling regimes resulting in higher ranges of displacements, velocities and vibro-impacting force. A pre-buckled (pre-compressed axially and pre-deflected transversely) rectangular PZT/steel/PZT plate in the form of a cylindrical panel is subjected to a 5 to 10 Hz burst of harmonic excitation. This type of loading causes cylindrical bending vibration in resonance regimes, followed by buckling and possibly chaotic motions. The fast transitions from one state of equilibrium to another provides strong vibro-impacting output signals. The vibratory buckling motion of the cylindrically bent plate is expected to be more efficient, in terms of the power consumption and displacements, compared to the buckling motion of more rigid structures such as spherical domes utilized in Rainbow m actuators. The overall design is expected to be low-cost for large-volume manufacturing and reliable in application. The buckling element is installed in an adjustable fixture that transforms a uniformly distributed vibro-impacting output to a relatively large area of the skin through the thickness of cloth. The design of the single tactor is intended to serve as a component for the spatial summation effect to increase vibratory simulation of the skin.

The present invention provides new vibrotactile transducers capable of safely producing adequate skin and surrounding tissue stimulus at low energy consumption. Specific objectives are as follows:

These and further and other objects and features of the invention are apparent in the disclosure, which includes the above and ongoing written specification, with the claims and the drawings.

6b shows modulated driving force G(t).

Figure 7:
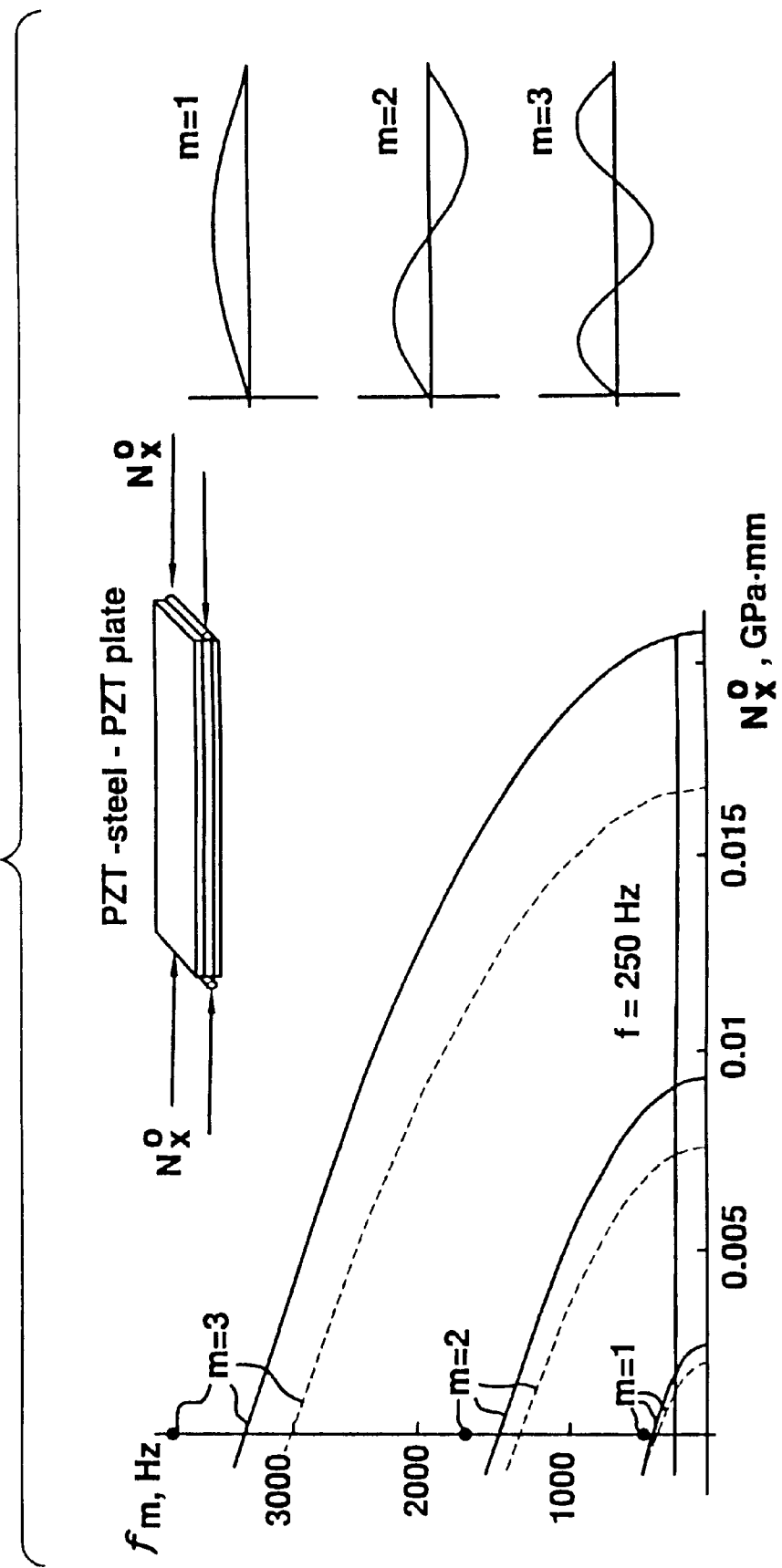

FIG. 7 shows the influence of in-plane compressive force $N_x^o$ on the fundamental frequencies $f_m$ of PZT-steel-PZT plate, where m=1,2 and 3. Solid curves are for $E_{PZT}=E_{11}=63GPa$ and dashed for $E_{PZT}=E_{33}=49GPa$. Dots are from an equivalent beam with no compression and $E_{PZT}=E_{33}=49GPa$.

FIGS. 8a–8g show SDoF systems without displacement jump. Displacements y vs. time t histories, velocity vs. y and acceleration vs. y diagrams for three systems having natural frequencies below (a, b), above (c, d) and equal to (e–g) driving frequency Ω.

FIGS. 9a–9f show SDoF systems with displacement jump and a driving signal with "burst". Displacements y vs. time t histories, velocity vs. y and acceleration vs. y diagrams for two systems in resonant regime ω=Ω=360. Maximum of the jump function is −1.3 (a–c) and −9.1 (d–f).

Figure 10:
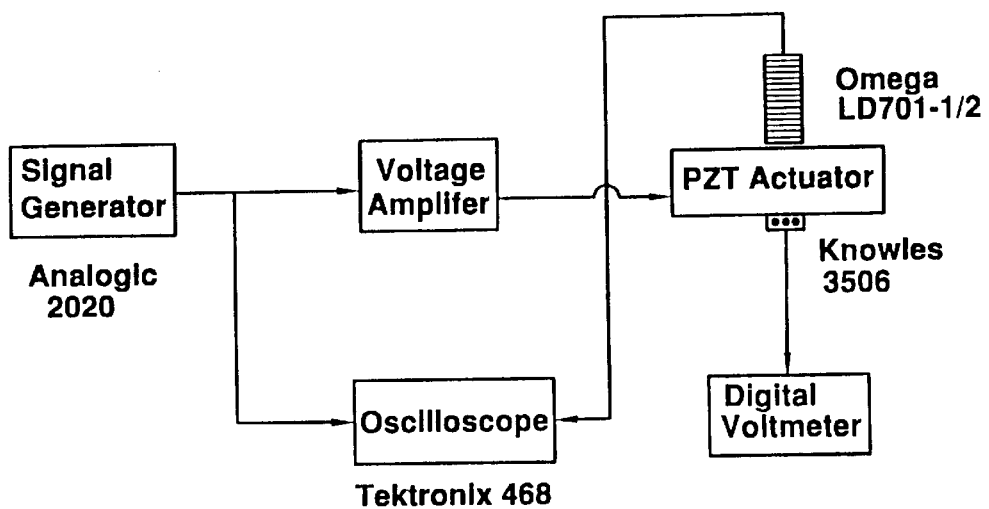

FIG. 10 is an experimental arrangement for electrical and mechanical characterization of the PZT actuator.

Figure 11:
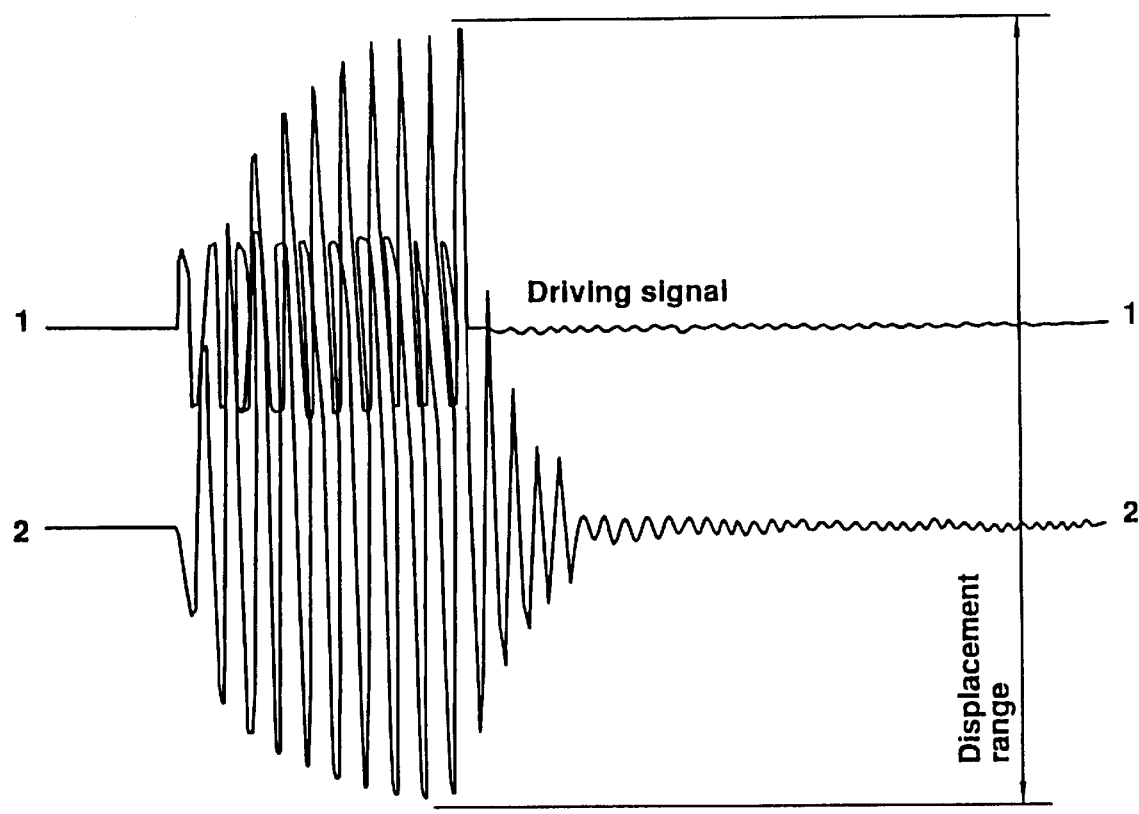

FIG. 11 shows the driving signal (with the zero-axis 1—1) and an asymmetric vibration of midpoint of PZT actuator (with the initial position 2—2), measured experimentally.

Figure 12:
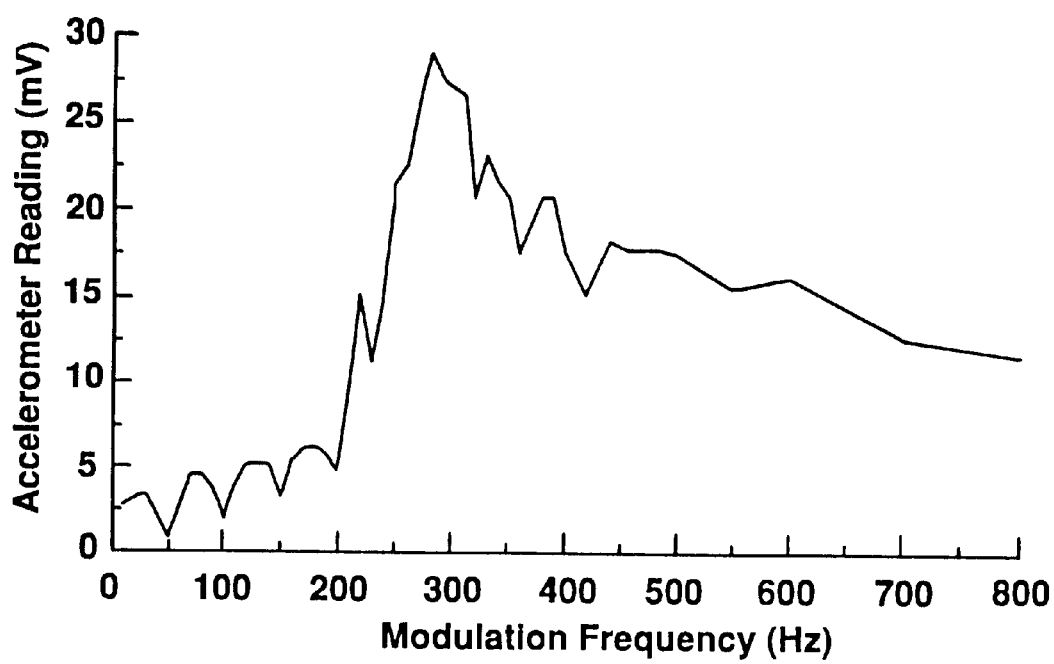

FIG. 12 shows the accelerometer reading of unloaded PZT actuator at various modulation frequencies.

Figure 13:
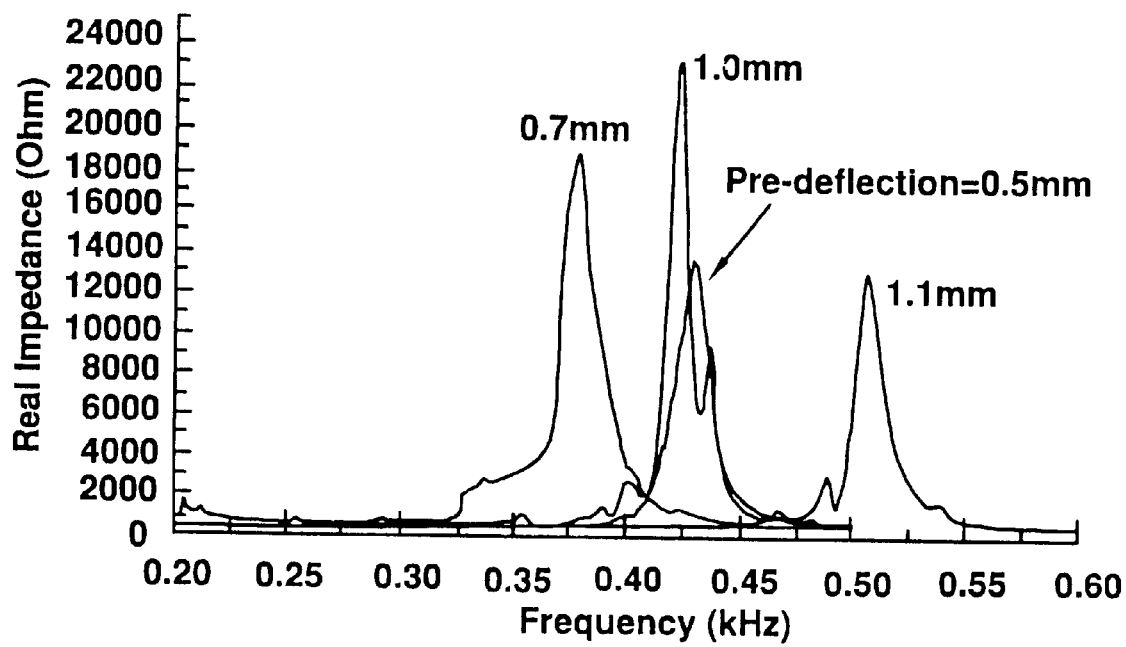

FIG. 13 shows the impedance spectrum as a function of pre-deflection.

Figure 14:
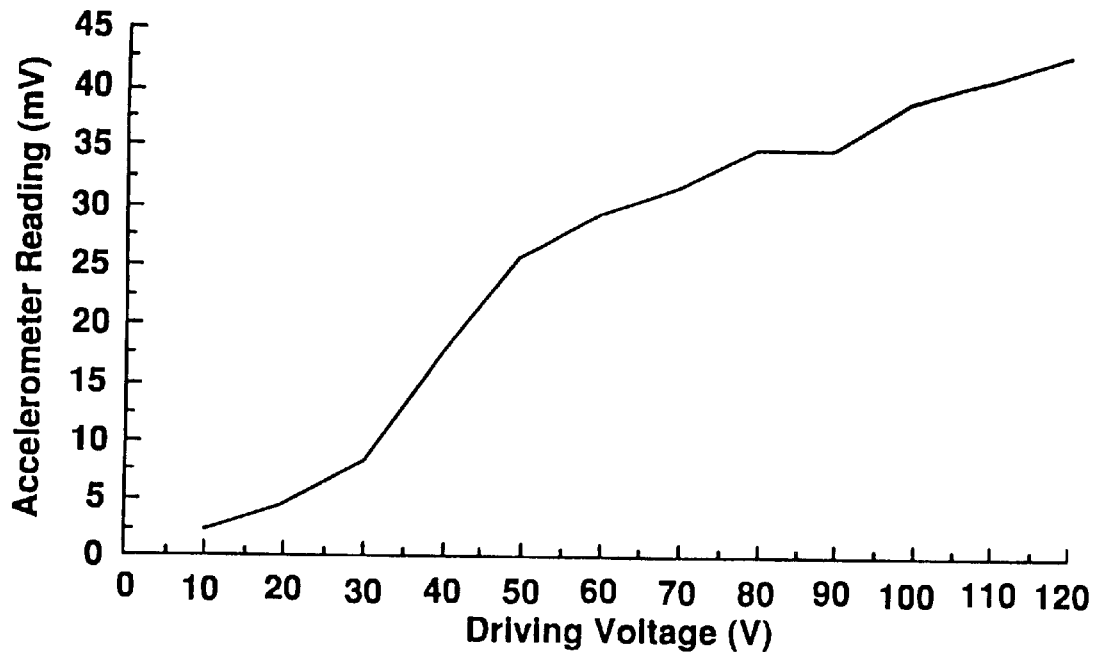

FIG. 14 shows an actuator response to magnitude of driving voltage.

Figure 15:
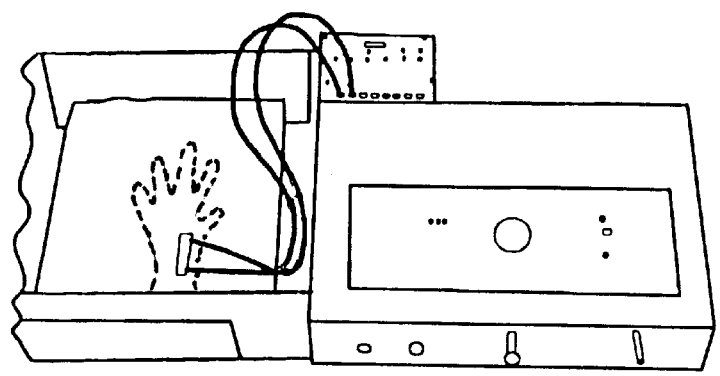

FIG. 15 shows a palm tactor and electronic amplifier.

Figure 16:
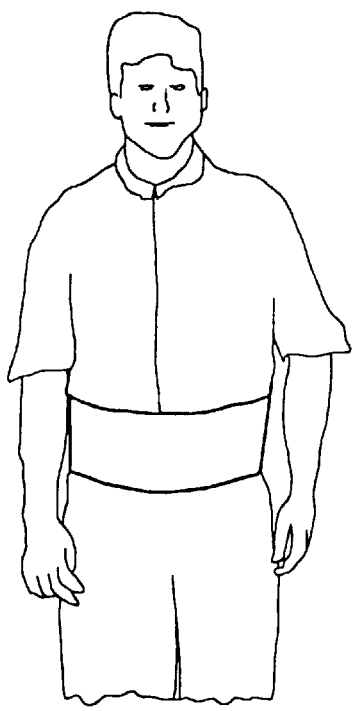

FIG. 16 shows a waist tactor.

Figure 17:
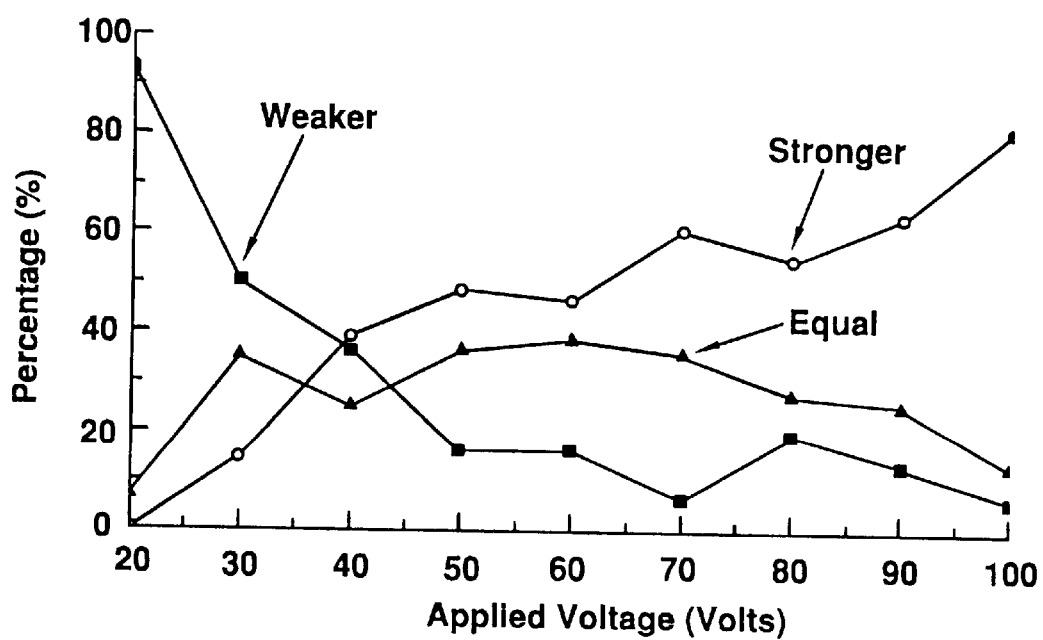

FIG. 17 shows the summary response to the PZT tactor at various levels of applied voltage.

DETAILED DESCRIPTION OF THE PREFERRED EMBODIMENTS

An efficient vibrotactile transducer designed for use in the areas of aviation, diving, biomedical and virtual reality applications is described.

Vibrating transducers were fabricated from high efficiency piezoceramic material in a manner useful to construct devices with two or more independent skin contacting surfaces. The tactor utilizes efficient mechanisms for transformation of the electric power supplied to PZT layers into a vibro-impacting output signal.

Figure 1:
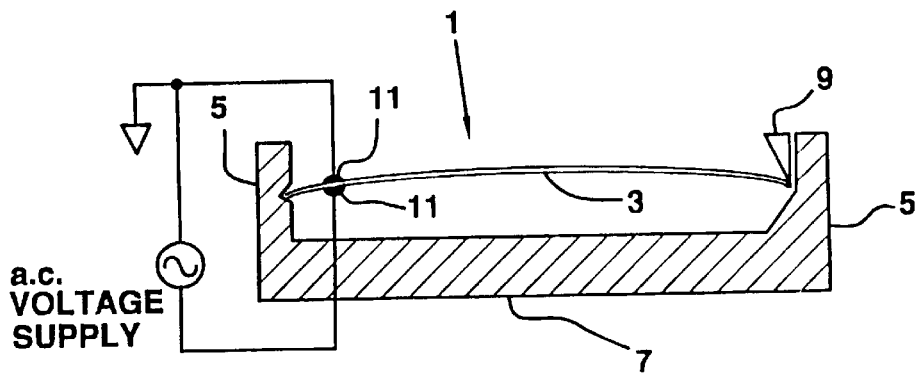
FIG. 1 schematically shows the tactor of the invention.

FIG. 1 schematically shows a preferred embodiment of the present invention. The present apparatus 1 includes a flat, elastic plate 3 that is pre-compressed and pre-deflected into an arch shape. The plate 3 extends between arms 5 of a mount 7. An adjustable component 9 is used to compress and deflect the plate 3.

The plate 3 is under transverse, periodic excitation. That excitation is provided through external actuators 11. Those actuators may be selected from the group of actuators including, but not limited to, piezoceramic actuators, shape memory alloys and electromagnets.

In a preferred embodiment of the present apparatus, the external excitation of the plate is provided by two layers of piezoelectric materials (lead zirconate titanate (PZT)). The piezoelectric layers are electrically poled such that the plate deflects from its equilibrium when an electric field is applied to the top and bottom of the plate. That creates an electromechanical stress on the PZT layers. When an alternating electric field is applied, the plate displays different vibration modes. The vibration mode displayed is dependent on the material characteristics, the initial compression and deflection, the frequency of excitation and the amplitude of the applied voltage.

At low excitation amplitudes, the plate deflects and vibrates around its equilibrium shape. Operating under that type of vibration mode, the present apparatus provides vibratory sensations, with the amplitudes of the sensations being relatively small. By increasing the amplitude of excitation, the vibrating plate buckles. The buckling phenomenon of the plate, which is in sharp transition from one equilibrium state to another, is periodic and/or chaotic. The buckling phenomenon creates a large mechanical impulse which results in larger sensations to the user than sensations resulting from the vibrating plate alone.

The buckling phenomenon of the present apparatus is achieved through continuous excitations or bursts of periodic excitations. The buckling phenomenon is generally easier to achieve using bursts of periodic excitations, due to the discontinuities in excitation. For example, in a PZT plate having dimensions of approximately 3.81 cm×1.27 cm×0.5 m and being under a pre-deflection amplitude approximately 1 mm, large sensations are achieved through a 5 Hz burst of sinusoidal waveform of 250 Hz frequency for 40 to 50 ms. The amplitude of applied voltage in that example is approximately 150 volts.

Figure 2:
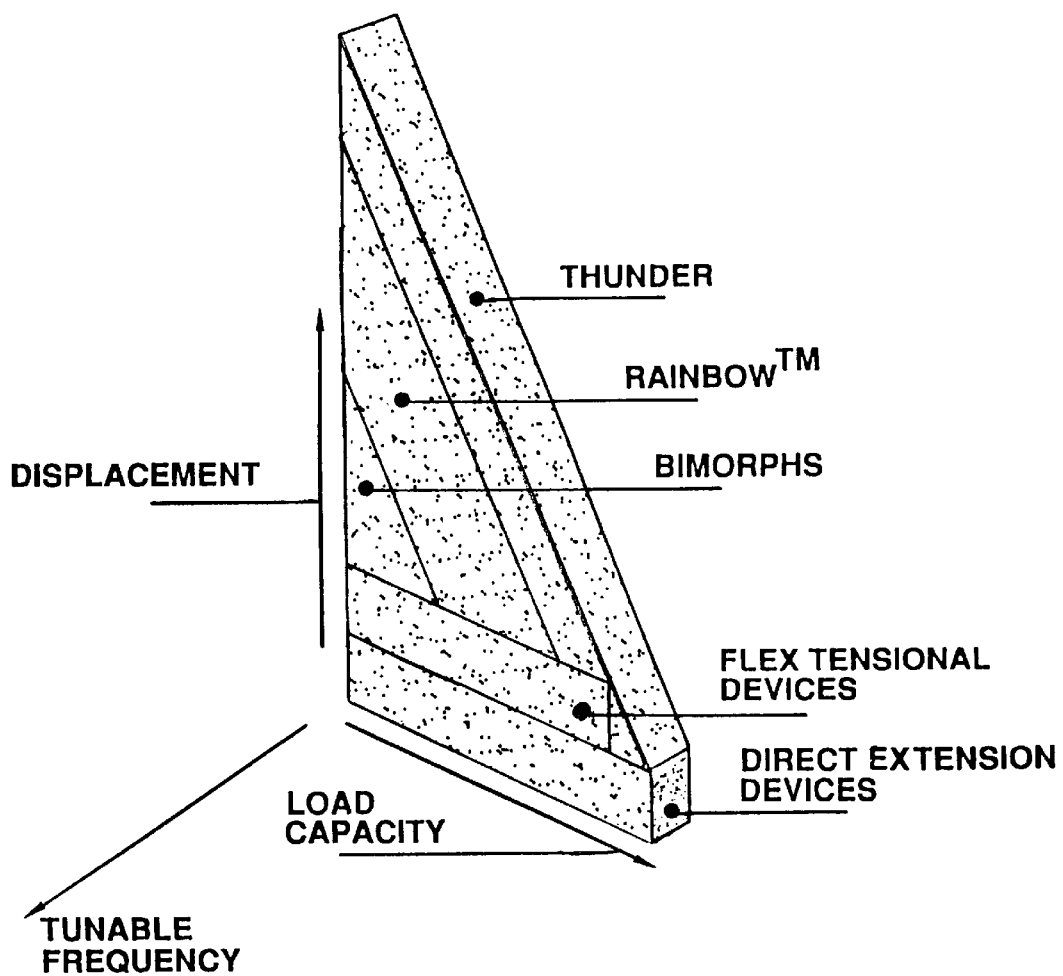
FIG. 2 shows typical piezoelectric actuators and requirements for high displacements, large force and tunable frequency.

To complement the design goals for piezoelectric actuators, a third dimension, namely, frequency controllability was introduced as depicted in FIG. 2. Combining the goals of maximizing both the dynamic force and displacements for a prescribed frequency, this approach resulted in a novel high displacement large force tunable piezoceramic actuator (Churchill, et. al., 1996). Structurally, the actuator is a rectangular steel plate laminated from the top and bottom by PZT layers. The two opposite sides of the plate are free while the two others are simply supported and compressed by axial forces from the supports. Under compression, initially flat plate deforms into a stressed shallow shell. The electrical driving signal applied to the PZT layers is a high-frequency time-harmonic voltage modulated by low-frequency "bursts" or "windows". The actuator generates uniformly distributed over a large area high force, with very large displacements, in resonant regimes. Its frequency is controllable or tunable by changing axial compression and pre-deflection. New and modified existing mathematical models were developed and used to evaluate effective regimes for the actuator, including a service regime with resonance at 250–280 Hz.

Figure 3:
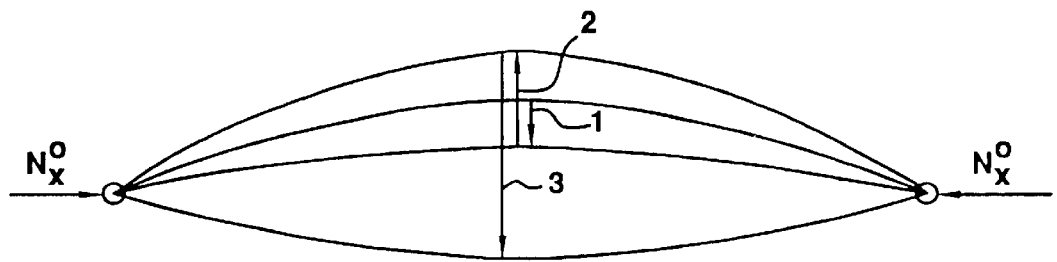
FIG. 3 shows displacements 1 to 2 (mode 1 vibration), and jump 3 in axially compressed pre-deflected actuator.

As shown in FIG. 3, the main element of the tactor is an axially pre-compressed and transversely pre-deflected rectangular plate with the two opposite edges simply supported and the other two edges free. The plate consists of a steel layer with two PZT layers attached to its upper and lower surfaces. The electrical input is a high-frequency time harmonic current with periodic "bursts". This electrical current, applied to the PZT layers, results in cylindrical bending motions of the plate and may lead to resonant regimes with buckling, and possibly, chaotic motions.

Modified existing and new mathematical tools for analyzing vibro-impacting behavior of the tunable PZT actuator including resonance regimes with displacement jumps were used. Schematically depicted in FIG. 3 the actuator motion consists of a mode 1 vibration, shown by arrows 1 and 2, with growing in resonance displacements and a displacement jump 3.

Figure 4A:
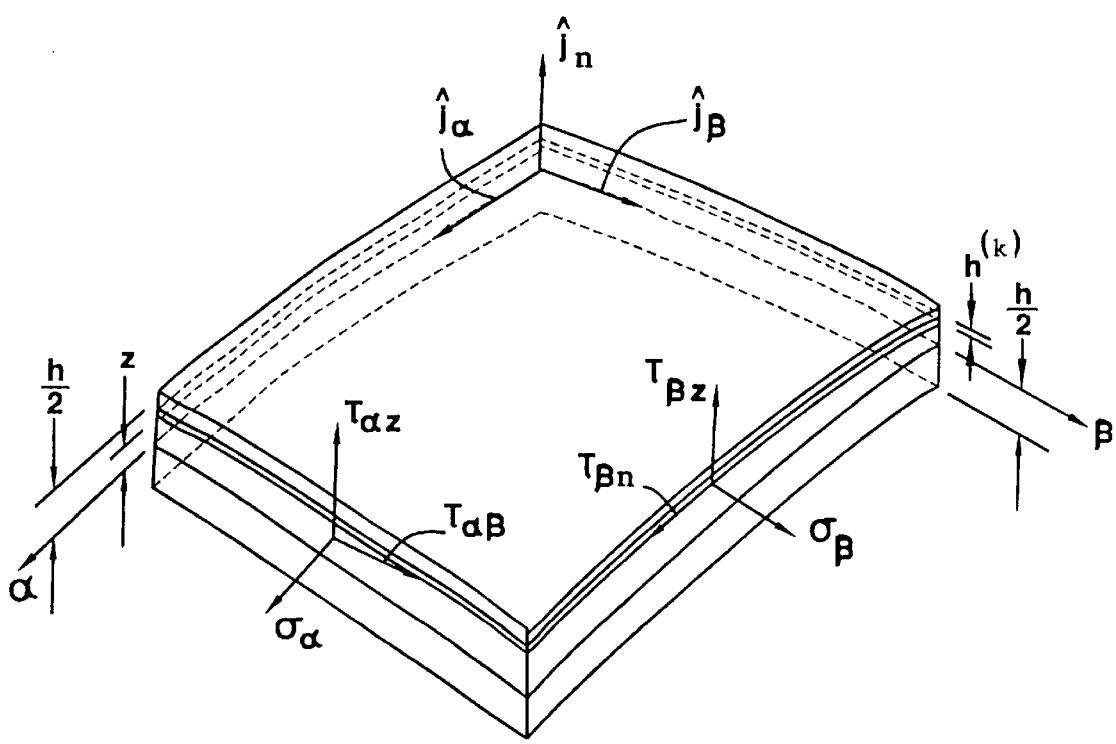
FIGS. 4a–4c show stress components (a), moment resultants (b) and force resultants (c) in shell coordinates.
Figure 4B:
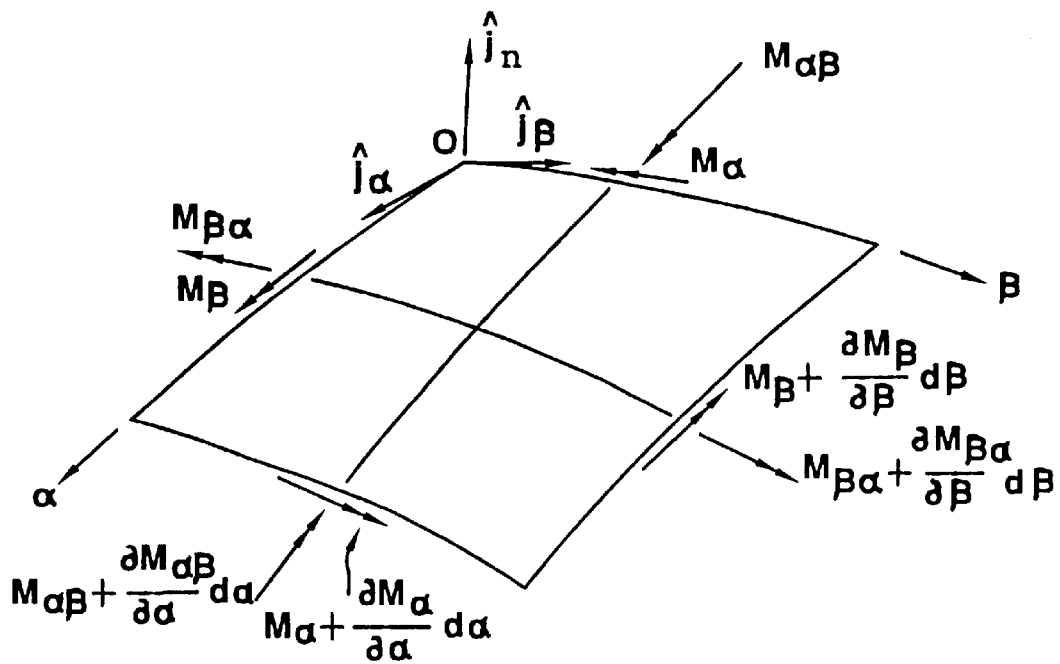
Figure 4C:
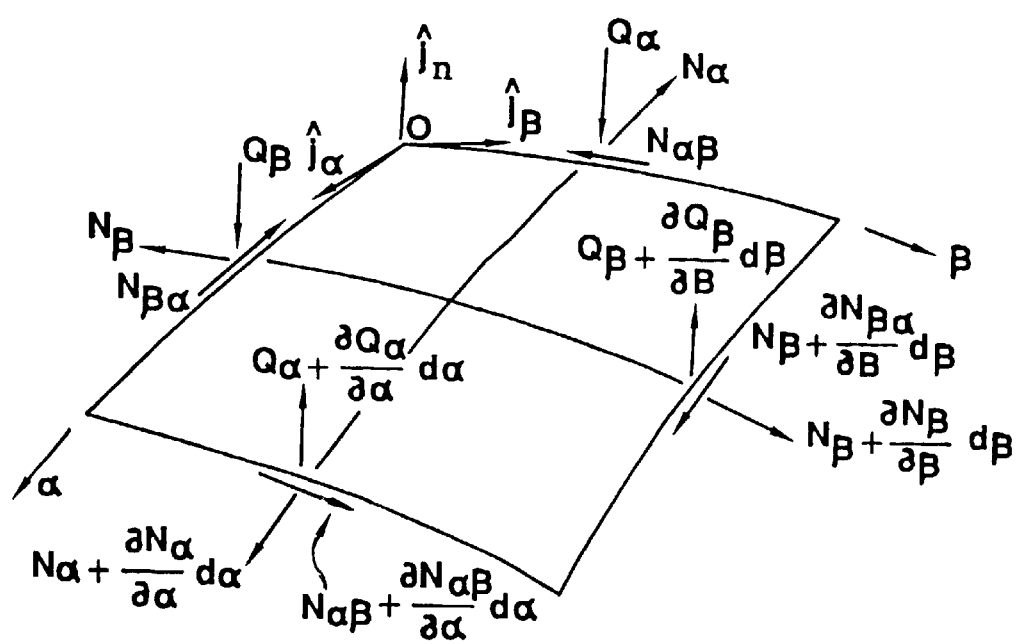

FIGS. 4a–4c show stress components (4a), moment resultants (4b) and force resultants (4c) in shell coordinates.

Figure 5:
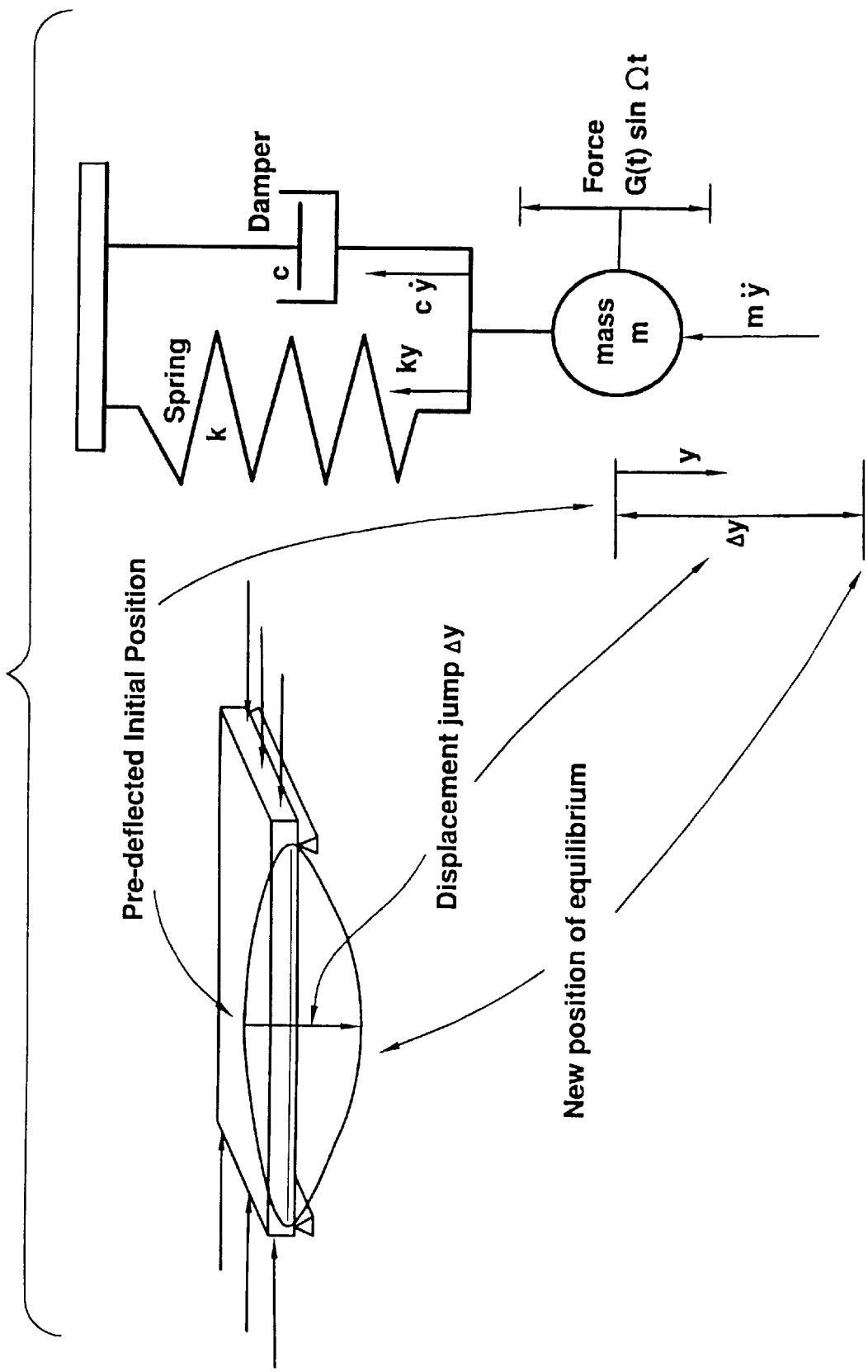
FIG. 5 shows the pre-deflected axially compressed plate and its equivalent SDoF model with displacement jump.

FIG. 5 shows an analysis of vibration with displacement g(t) characterizing a displacement jump from an initial state of equilibrium jumps in the system that is excited by a modulated harmonic signal, to another state of equilibrium, and then back to the initial one.

Figure 6B:
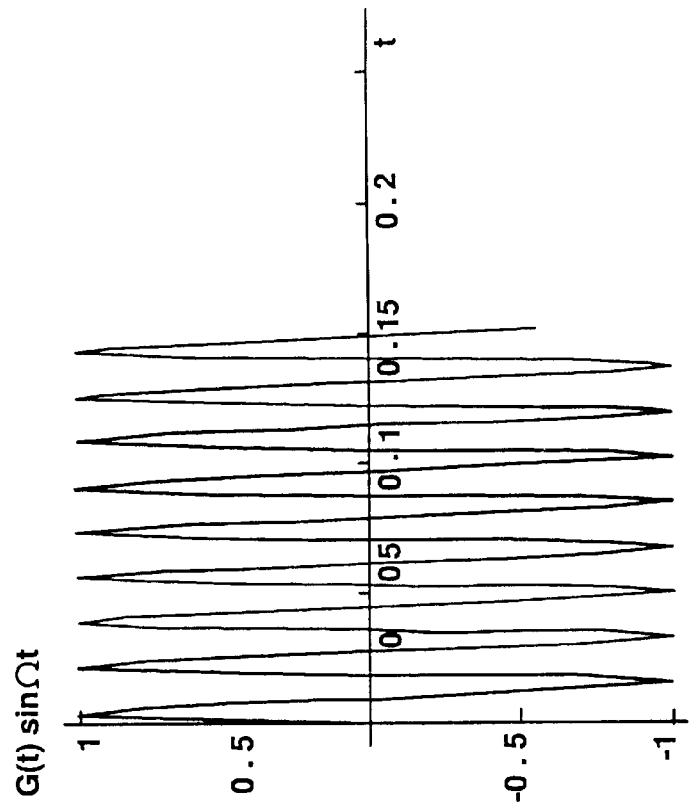
FIGS. 6a shows the displacement jump g(t)
Figure 6A:
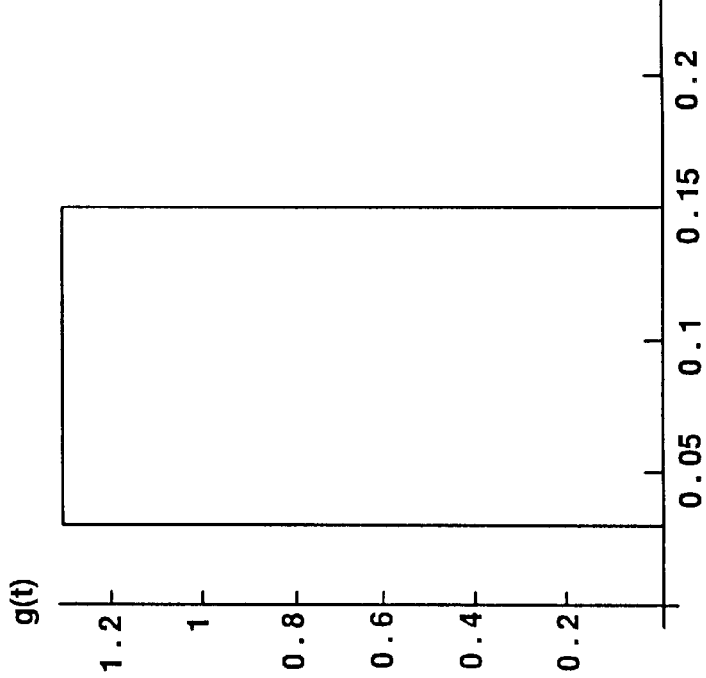

FIG. 6a shows a function g(t) characterizing a displacement jump from initial state of equilibrium with y=0, for the period of time 0<t<0.02, to another state of equilibrium with y=y*, for 0.02<t<0.15, and then back to initial position, y=0, when t>0.15.

FIG. 6b illustrates a driving force that is a time-harmonic, sin(kt), within a "burst" function G(t)=1 during time interval 0<t<0.015.

In preferred embodiments, for a basic element of the actuator, the following rectangular three-layer PZT-steel-PZT plate was considered: length L=38.1 mm, width b=12.7 mm, thickness of each PZT layer, $h_{PZT}$=0.127 mm, thickness of the steel layer $h_M$=0.127 mm. The orthotropic G1195PZT material has the following parameters: Young's moduli in two directions when the electrodes are shorted are $E_{11}$==63 GPa, $E_{33}$==49 GPa, Poisson ratio $\nu_{PZT}$=0.3 and mass density $\rho_{PZT}$=7.65 mg/mm$^3$. The isotropic 302 stainless steel has Young's modulus $E_M$=207 GPa, Poisson's ratio $\nu_M$=0.3 and mass density $\rho_M$=8 mg/mm$^3$. For practical application, it was desirable to achieve a resonance at 250–280 Hz.

Computations for a simply supported axially compressed flat laminated plate were performed. The 1st, 2nd and 3rd frequencies monotonically decrease with the increase in axial compression. Solid curves in FIG. 7 correspond to the case when the PZT material is taken as an isotropic with $E_{PZT}$=$E_{11}$=63 GPa and dashed lines to $E_{PZT}$=$E_{33}$=49 GPa. For modes 1, 2 and 3, the intersections of the curves with the vertical axis give values of fundamental frequencies when axial force is equal to zero. The fundamental frequencies computed from both plate (Equations 34, 35) and beam (Equation 40) models are summarized in Table I. The values of fundamental frequencies of the beam model are higher than those of flat plate.

The intersection of solid ($E_{PZT}$=$E_{11}$=63 GPa) and dashed ($E_{PZT}$=$E_{11}$=49 GPa) curves with horizontal axis show critical values of compressive force resulting in a transition from flat to a deflected shape. The shape transition for mode 1 requires minimal compressive force, that is 0.0019 GPa·mm for $E_{PZT}$=49 GPa and 0.0024 GPa·mm for $E_{PZT}$=63 GPa. The intersection of the curves with the horizontal line f=250 Hz suggest the values of axial compressive force to achieve resonance for modes 1, 2 and 3.

FIGS. 8a–8g depict time-displacement histories for two different states of equilibrium: y*=2 and y*=3.6. Comparison with experimental observations presented in FIG. 11 revealed qualitative similarity in resonance vibratory buckling behavior.

Figure 8B:
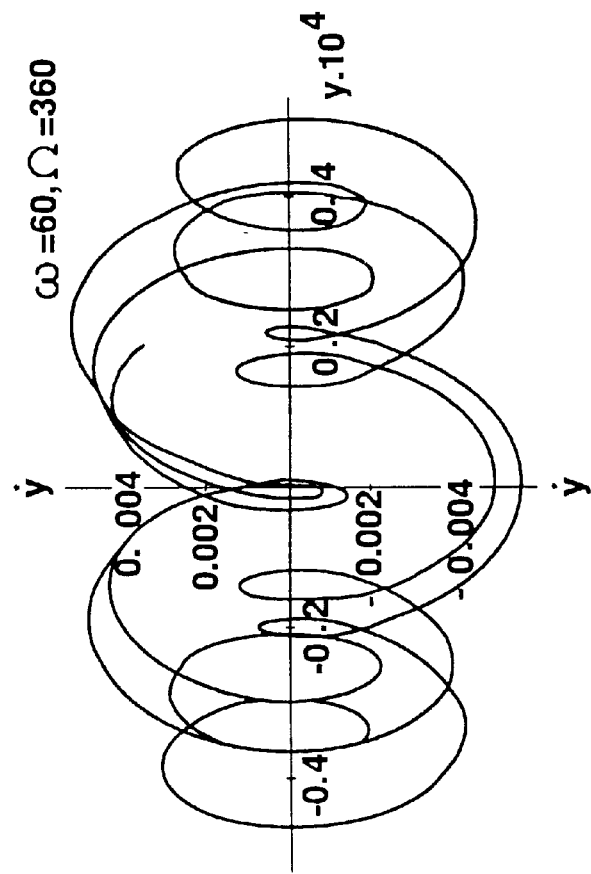
Figure 8A:
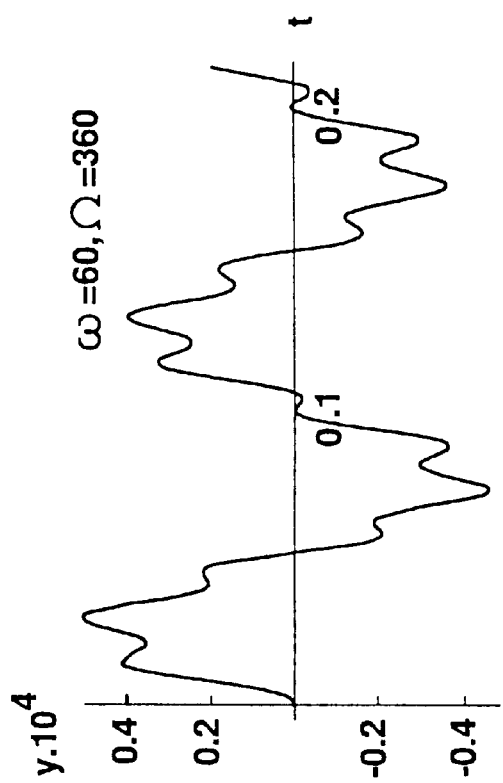
Figures 8E, 8F:
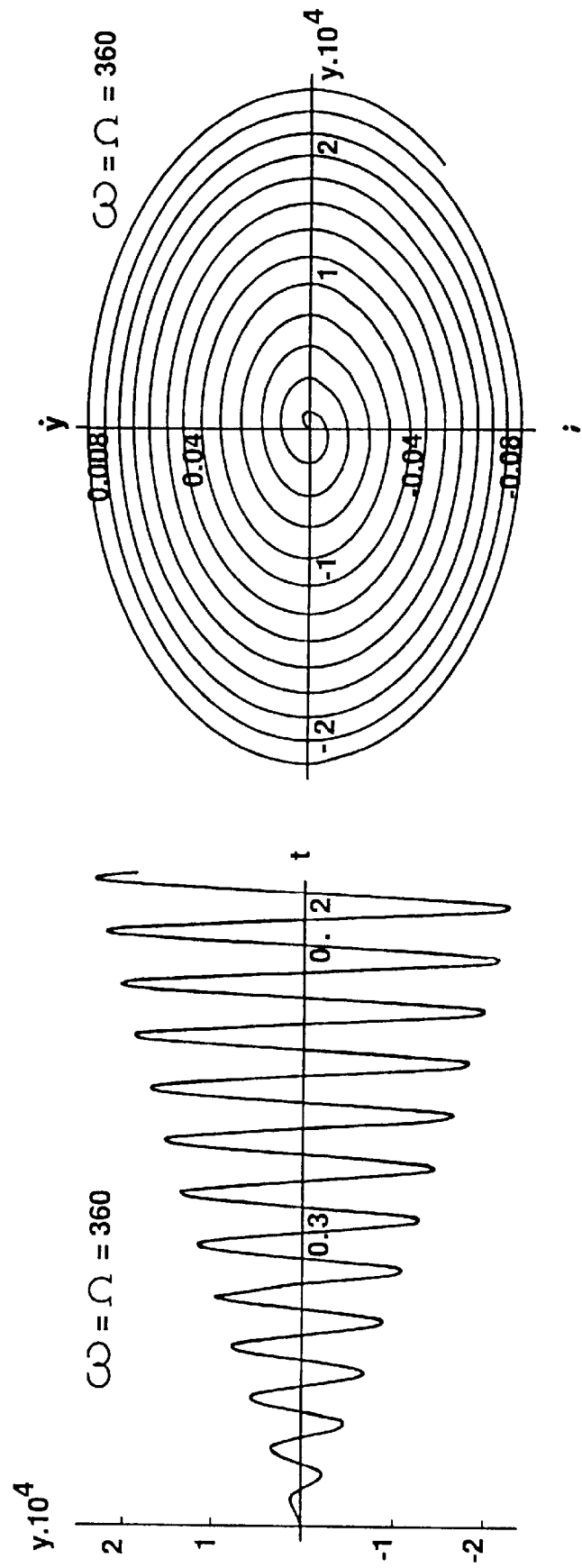
Figure 8G:
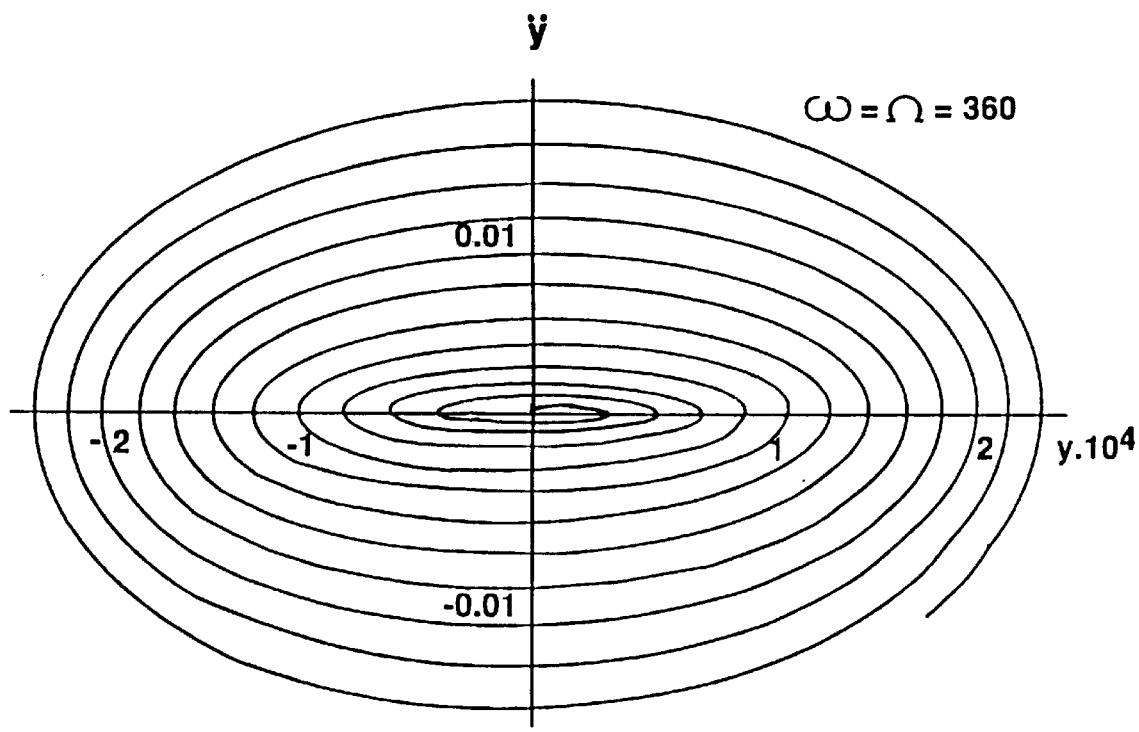
Figure 9D:
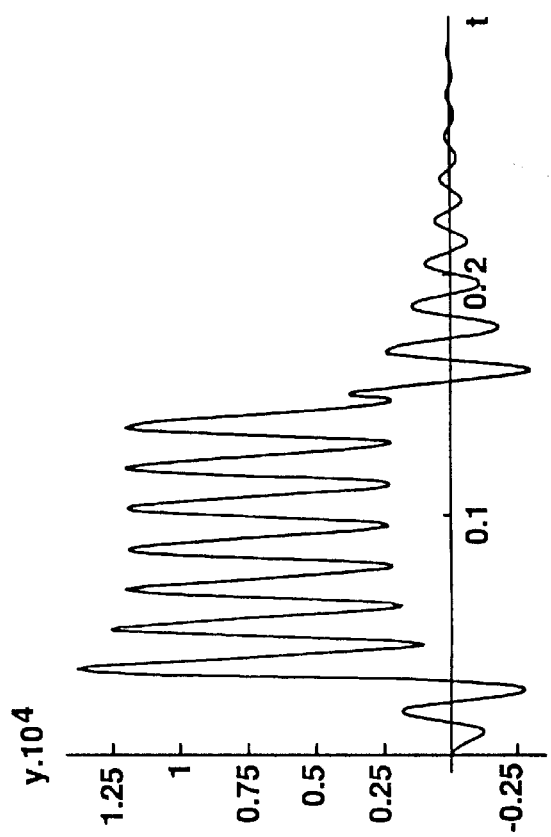
Figure 9A:
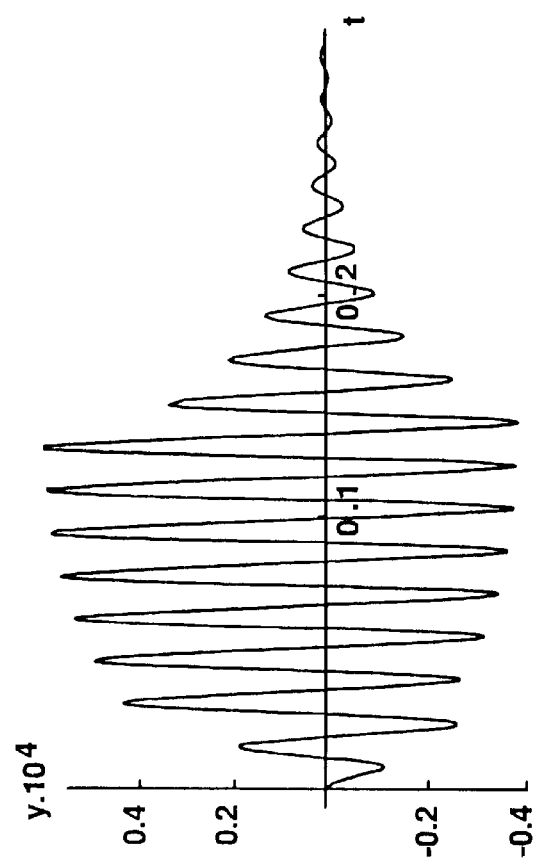
Figure 9E:
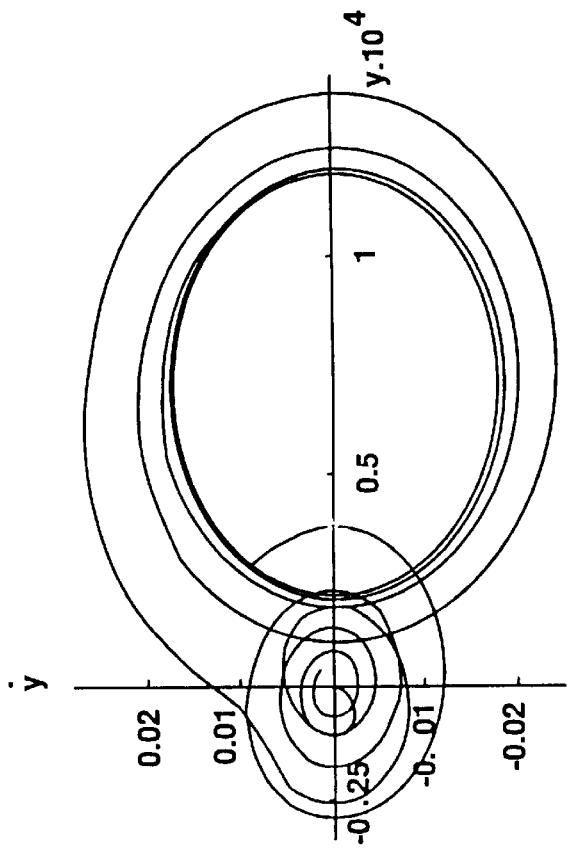
Figure 9B:
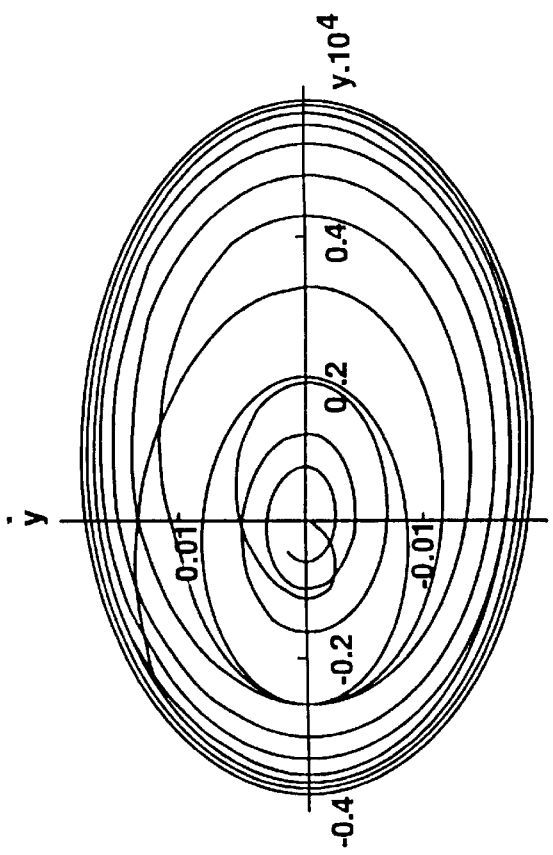
Figure 9F:
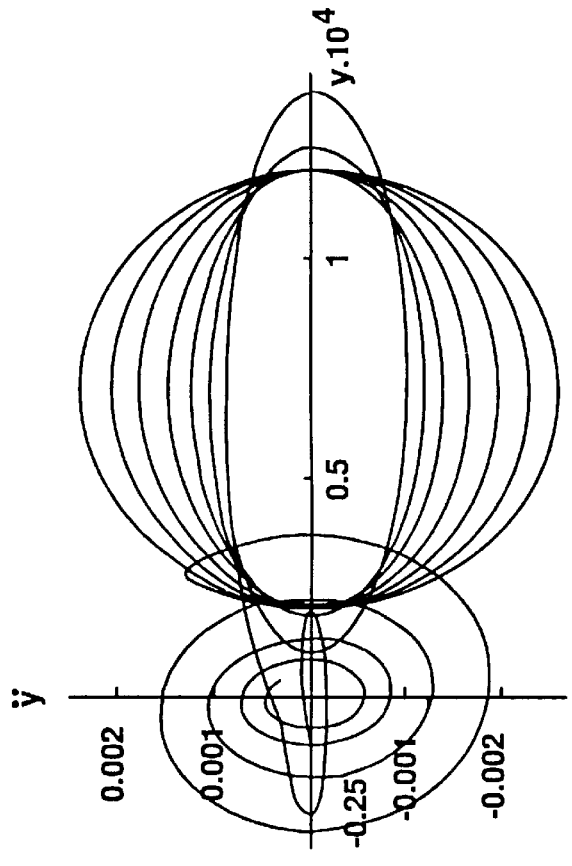
Figure 9C:
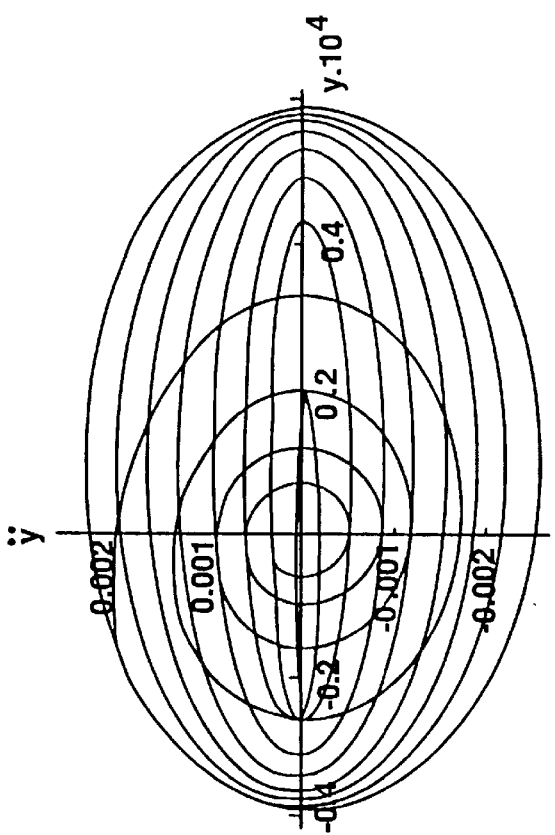

FIGS. 8a and 8b show relatively high displacements but smaller velocity range, than FIGS. 8c and 8d. For resonance, the magnitudes of displacement, velocities and acceleration rapidly grew, see FIGS. 8e–8g. These results suggested the use of resonant regimes to achieve high displacements and large dynamic forces that are proportional to acceleration and mass. Also, "acceleration vs. displacement" diagram are useful for finding regimes with maximal both dynamic force and displacement (for example, for design and dynamic analysis of pumps). The displacement jump function g(t) and driving force G(t) were taken with the same parameters as shown in FIGS. 6a and 6b. In the computations, the range of jump magnitudes.

FIGS. 9a–9f show displacement—time histories and phase diagrams. Compared to a small jump, the system with the same set of parameters but zero-jump exhibited vibrations symmetric with respect its initial position with symmetric phase diagrams. The system with a larger jumpy exhibited large-range displacements with higher velocities, but almost the same level of accelerations as for the case of small jump. Within the "burst", the small-jump system exhibited a large-scale vibrations about an axis that is shifted upward with respect to the initial position, while the large-jump system showed explicit separation of the two positions of equilibrium. Both displacement jump and the separated equilibrium positions are also clearly visible from the "velocity vs. displacement" and "acceleration vs. displacement" diagrams on FIGS. 8e,d.

The results of computation using SDoF model suggested that there is an optimal range of relatively small pre-deflections for piezoceramic actuator that would not damage brittle PZT layers and would generate maximal both impact forces and displacements.

The experimental setup is shown in FIG. 10. The programmable waveform synthesizer Analogic Model 2020 generated the input voltage signal in the form of 5 to 10 Hz sinusoidal or square wave consisting of 1 volt amplitude "bursts". The duration of each "burst" was 60 ms. The signal was amplified up to 156 volts and applied to axially compressed and pre-deflected PZT actuator. The actuator displacements were recorded by using the sensor OMEGA Engineering Model LD 701-1/2 and accelerations by using accelerometer Knowles Model BU3506. The accelerometer was attached to the reverse side of the actuator using double-sided tape and its output was monitored using the oscilloscope Tektronix Model 468 and a digital voltmeter to measure the root-mean-square of the output signal. Electrical and mechanical parameters of the actuator were evaluated using the impedance analyzer HP Model HP4194A.

The actuator was tuned, i.e. pre-deflected and axially compressed, and then driven into resonance. FIG. 11 shows a driving signal and a displacement vs. time curves for the PZT actuator. The driving signal is similar to that depicted in FIG. 6. The maximum displacement attained by the center of PZT actuator was approximately 1.5 mm. The asymmetry of the displacement-time history with respect to the initial position of equilibrium indicates a regime with displacement jumps similar to theoretically predicted (FIG. 8a).

Accelerometer reading of unloaded PZT actuator at various frequencies is shown in FIG. 12. The driving voltage was approximately $60V_{p-p}$. A mechanical resonance of the actuator was achieved at 280 Hz. For an arbitrary cut off level of 20 mV, the frequency range of the PZT actuator was between 250 to 390 Hz. For these and higher frequencies, the actuator exhibited several large-force, large-displacement resonance regimes.

FIG. 13 shows the impedance spectrum of the tactor with an increasing tuning force which varies the resonant frequency. With a pre-deflection of 0.5 mm, it was observed that a transition occurs at 430 Hz. The tactor was tuned until the lowest frequency was achieved. It was observed that as the compressive loading increases, the transition moves towards a lower frequency as predicted in a mathematical model developed during the invention. However, at an even higher compressive force, the transition moves back to a higher frequency. At the lowest transition frequency, the degree of transition is larger which indicates the highest transmission of electrical energy to mechanical energy. It was also observed that the transition frequency is related to the mechanical resonance by a difference of approximately 50 Hz. Therefore, the tactor fabricated resonates at around 380 Hz.

FIG. 13 illustrates the impedance spectrum as a function of increasing both compressive force, from simply supported ends, and pre-deflection in the center of the actuator. For a 0.5 mm pre-deflection in the center, a transition was at 430 Hz that is close to the theoretical predictions. With further increase in the pre-deflection, from 0.5 to 0.7 mm, through increase in axial compression, the transition moved to a lower frequency range, similar to the trend predicted by the model of axially compressed flat plate. However, with further increase in the pre-deflection, from 0.7 to 1.1 mm, and conversion from a shallow shell configuration to a deep shell, the transition moves to higher frequencies. At low transition frequencies, the degree of transition is larger that indicates an efficient conversion of electrical energy into mechanical. It was also observed that the transition frequency is related to the mechanical resonance by a difference of about 50 Hz.

Accelerometer reading as a nonlinear function of the magnitude of driving voltage is shown in FIG. 14. Considered in this experimental work high-displacement and large-force resonance regimes usually did not cause failure of brittle PZT layers.

The electrical and vibration analysis of a novel tunable piezoceramic actuator is performed by using mathematical models and experimental techniques. The pre-compressed and pre-deflected actuator was driven by an electrical signal that is a time-harmonic current within impulsive square-type "bursts" or "windows". The actuator exhibited tunable large-force and large-displacement resonance behavior. Further studies and optimization of the actuator will need incorporating nonlinear models and mathematical tools and analyzing transient large-displacement and possibly chaotic regimes.

A rectangular PZT/steel/PZT was laminated. The two PZT layers were made of orthotropic G1195PZT material. The layer between the PZT layers was made of type 302 stainless steel.

Computations for a simply supported axially compressed laminated plate were performed. FIG. 7 depicts the influence of axial compression of the first, second and third fundamental frequencies. The intersections of the curves with the horizontal axis show values of buckling load for modes 1, 2 and 3. Minimal buckling load, 0.0019–0.0024 GPa.mm corresponds to the fundamental mode, m=1. For comparison purposes, eigen frequencies of an equivalent homogeneous plate were computed.

The use of a piezoelectric ceramic vibrating element represents a reduction of electrical power needed to drive the vibrotactor. The power consumption of the vibrotactor is estimated by computing the power requirement in charging an equivalent capacitor for the PZT material. The PZT structures that are being used in the present tactor operate at a maximum of 100V, with a capacitance of 20 nF. Assuming a driving signal having a frequency of 300 Hz and a modulation frequency of 5 Hz with a pulse width of 60 ms, then the computed power consumption is 9 mW. The low power consumption and high detectability enables the construction of a 64 element array for use in the present tactor.

Human subject test results were used to compare the PZT tactor with the Navy benchmark tactor. The experiments with the PZT tactors included tests using the tactor stimulation at the palm area and at the waist using the tactor belt.

At the conclusion of each test, the test subject was asked to provide a subjective judgment of the stimulation from the PZT tactor and the Navy benchmark tactor. Several test users reported the sensation of the PZT tactor as being "crisper" and "sharper", and the larger area and more equalized tactile feel provided deeper tactile penetration as compared with the more localized sensation provided by the benchmark tactor.

Optimization of Vibrotactile Transducer Model

A PZT palm tactor and a belt tactor were designed and developed.

A tactor belt was also fabricated to provide a sensory summation effect which increases the tactile sensation. To provide means of arranging groups of tactors into various patterns so as to determine optimum placement and physical separation, a MYLAR backing material was selected and Velcro loop material was applied. Velcro hook material was applied to individual tactors, and experiments were performed with multiple arrangements at several body sites. Once the optimum tactor arrangement was determined, the dimensions of the MYLAR backing were reduced to the minimum necessary to accommodate the arrangement.

Tactor arrangements were next secured to various body sites using a belt constructed of two layers of material. The inner layer consists of a stretch fabric such as spandex or lycra to provide maximum transmission of vibration. The outer layer consists of a stiff thick fabric with a Velcro and elastic closure. Tactor arrangements are placed between the two layers of material and held in place by tension from the elastic closure which serves to hold the arrangements firmly against the body. By constructing this belt in two layers it is possible to slide multiple tactor arrangements within the belt to assess their effectiveness at different body sites along the waist circumference.

Preliminary results have shown that the waist belt tactor provides large tactile sensation, and sensory summation effect is achievable with three PZT tactors configured in a triangular arrangement.

A series of experiments to characterize the electrical and mechanical properties of the PZT tactor were conducted. These experiments provided the specifications of the tactor fabricated. Tests on human subjects were also conducted to determine the efficiency of the transduction of information to the users or alerting the users.

To determine the electrical characteristics of the tactor system, the tactor was connected to an impedance analyzer (Hewlett-Packard Model HP4194A) and the impedance versus frequency curves were measured. The impedance versus different frequencies provides information on the electrical resonance behaviors of the tactor systems under investigation. The mechanical characteristics of the tactor system were measured through the use of the experimental setup as shown in FIG. 9. A programmable waveform synthesizer (Analogic Model 2020) was used to generate the input voltage signal. The signals were 5 to 10 Hz burst sinusoidal or square wave with 1 Volt amplitude. The duration of the burst was 60 ms. The signal was amplified by a custom built power amplifier which stepped up the input signal to a maximum of 156 volts.

The output of the amplifier was used to drive the PZT tactor. Two types of sensors were used to characterize the vibrating tactor. A displacement sensor (OMEGA Engineering Model LD 701-1/2) was used to record the displacement of the vibrating plate. An accelerometer (Knowles Model BU3506) was used to monitor the acceleration obtained by the PZT tactor. The accelerometer was attached to the back side of the tactor using double-sided tape. The output of the accelerometer was monitored either using an oscilloscope (Tektronic Model 468) or a digital voltmeter to measure the root-mean-square of the output signal.

A pilot study was conducted using human subjects to determine the feasibility of transducing information to users through the piezoelectric transducer devices. As a comparison with the benchmark tactor developed at the Naval Aeromedical Research Laboratory (NARML), this portion of human subject testing comprised psychophysical testing protocols, data collection and reporting which closely followed a manual provided by the NAMRL entitled "Tactile Advanced Technology Demonstration Program: Tactor Development Benchmark" (FRANKLIN, et al., 1995).

A benchmark prototype system was provided to ARCOVA as a standard to which the system under development is compared. The benchmark prototype consisted of a V1242 transducer (Audiological Engineering Corp., Somerville, Mass.) and an accelerometer (Knowles Model BU1771) mounted to the underside of the transducer using double-sided tape. The benchmark prototype was then mounted on a foam block to control application force.

Ten subjects, consisting of five males and five females, were involved in this pilot test. The age span of the subjects ranged from 27 to 36 years old. All subjects except one were right handed. The subject placed the left hand on the Navy benchmark tactor and the right hand on the PZT tactor with the thenar eminence of the palms contacting the tactor surfaces. The acoustic noise of the tactor devices was masked from the test user by having the user wear a sound insulating headphone. The Navy benchmark tactor was driven by a 290 Hz sinusoidal waveform with $6_{p-p}$, while the PZT tactor was driven at different applied voltages with a 360 Hz sinusoidal waveform. Both tactors were modulated ON and OFF at a frequency of 5 Hz to reduce user fatigue. Before the test, the user was given two trial tests in which the voltage to the PZT tactor increased from 20 to 100V in steps of 10V.

The human subject test involved determination of the applied voltage to the PZT tactor at which the tactile stimulation is roughly the same as the Navy benchmark tactor. Four different sequences were given to the subject, in which two sequences were in the ascending order and two sequences were in the descending order. The applied voltage level was between 20 to $100V_{p-p}$ in step of 10V. On the first sequence, the test subject was presented a level of the comparison stimulation that they judged to be less intense than the benchmark, and then a level they judged to be equal to the standard, and then more intense than the standard. In the second sequence, the stimulation intensity was reversed in a descending order. In the third sequence, the stimulation intensity was in a descending order, and the last trial was in an ascending sequence. On each trial, the subjects received a standard stimulus on the left palm followed by the comparison stimulus on the right palm. Each stimulus lasted for approximately one second, and there was at least a one second time lapse in between the benchmark stimulus and the PZT tactor stimulus. The response of the user to different tactile stimulation, which is designated as weaker, equal or stronger than the Navy benchmark tactor, was reported verbally to the test administrator.

The optimization of the PZT tactors of the invention includes evaluation of approaches to miniaturize the PZT tactor reduction in applied voltage to improve safety advanced finite elements analysis for tactor optimization device packaging for underwater operation optimization of the PZT materials. Thus a highly efficient, rugged, small size PZT tactor is shown with sufficiently large stimulus to be integrated into flight suits.

Several tactors based on lead zirconate titanate (PZT) multiple layer structures were designed and fabricated. The resulting tactors were compact, light weight, and with low power consumption. A typical PZT tactor preferably has dimensions of 3.8 cm×1.3 cm×3 mm, and weighs only 4.2 g. The small physical dimensions and light weight of the tactor fits well into flight suits.

FIG. 15 shows the palm tactor together with the amplifier.

FIG. 16 shows the waist tactors as worn on the user's waist. In preferred embodiments, the tactors may occupy about a 1.5cm$^3$ volume, which was a result of considerations including ease of Fabrication, availability of materials, and desire for a range of experimental resonances.

FIG. 17 shows the summary response to the PZT tactor at various levels of the applied voltage. The equal stimulus curve shows a maximum at $60V_{p-p}$ which represented the level that most test subjects reported where the PZT tactor provided them equal stimulus to the Navy benchmark tactor. However, due to individual differences in tactile sensitivity, the width of the peak was wide. Generally speaking, an applied voltage of 40 to $80V_{p-p}$ or 14.1 to $28.3V_{rms}$ is considered sufficient for all test users to adequately feel the PZT when the users' palm area was used.

Miniaturization of the tactor is both strongly desirable and quite feasible. Smaller tactors allow for the assembly of highly dense matrix arrays without being bulky or uncomfortable to the wearer. Better information transfer and a greater communication bandwidth results. Tactor volume may be reduced to about 1cm$^3$ using a "single chip" design. By providing specialized fabrication facilities and a customized material, a high volume, low cost design is produced in an optimized configuration. Likewise, the associated drive electronics are also markedly miniaturized by the design and manufacture of conventional ASIC thin film micro circuits.

Although the tactor is fully enclosed and not in direct contact with the wearer's skin, it is desirable to keep the power supply voltage as low as possible. The demonstration tactors operated over an experimental range of drive voltage from 40 to 80$V_{p-p}$. Voltage reduction is accomplished by using improved materials and/or modifying the transducer structure to consist of lower voltage elements connected in parallel. Preliminary tests indicate that the parallel structure combines to provide an equivalent force as compared to the single element configuration.

An interesting by-product of the transducer mechanical motion is the generation of an audible acoustic tone. Although quite weak, that tone is undesirable for SEAL operations. It is possible to reduce the acoustic signature to acceptable levels by packaging techniques, internal phase cancellation, or absorption through a pressure equalization fluid as may be used in underwater operations.

Prediction of kinematic operating characteristics is essential for the design and optimization of electromechanical tactors. An analytical model enables theoretical comparison of different configurations including such performance factors as force, amplitudes, resonant frequencies, and harmonics. Such models were constructed and successfully utilized in this invention using differential equations which were analyzed and solved with Mathematica software.

Achieving effective optimization of the piezoceramic transducer requires that a more sophisticated finite element model be created. This type of model more accurately portrays the physical configurations in terms of trading off material properties, power inputs, structural miniaturization, frequency response, and drive voltage levels.

The tactor may play an important role in SEAL operations by serving as the communication means to provide underwater guidance information. In this role, the tactor is immersed to wet suit scuba diver depths. A different form of packaging may be provided as compared to the flight suit environment. Waterproofing and pressure equalization may be considered in the packaging approach.

Looking at the SEAL application as a unique set of functional requirements, fewer tactors are utilized and the packaging is integrated into the wet suit or an accessory belt worn internal to the wet suit. In these situations the waterproofing approach is less extensive than if the tactor was worn externally like a compass or depth gauge. For the external case, pressure equalization by sealing the tactor in a fluid such as alcohol (to minimize damping) may be provided. If worn internally, a pressure resistant hemispherical "hard shell" protects the tactor while still allowing skin contact through a thin membrane across the diameter.

Geometrical optimization refers to the arrangement of the PZT layer and its substrate. Experimental geometries have been fabricated where thin foil layers surround a piezoelement with this assembly in turn bonded to a curved (prestressed) wafer. This structure is being evaluated for micro-miniature actuators. A leader in this work is the NASA developed "thunder" material. It provides a larger output amplitude because as the element moves, the foils experience tension and vice-versa. Further, the composite laminate affords additional strength to the ceramic element by limiting the formation and propagation of cracks which lead to breakage.

One of the major concerns involving a device to be embedded within clothing is its thickness. The bimorph structure consists of thin layers of piezoceramic material and a thin center shim of stainless steel. The invention includes means to minimize or eliminate any packaging of the transducer which would add thickness, an improvement is thus made which enhances the practicality of such devices.

The bimorph structure material was processed utilizing metal stamping techniques to develop pre-compressed buckled structures. Sample dies were constructed which shortened portions of the bimorph structure by crimping with respect to other portions designed to undergo compression. Next the PZT laminated structure was placed within the die and subjected to compression. Once removed from the die, the samples displayed arched, buckled, regions which are made to snap back and forth between two steady positions with the application of little force. Such devices may be arrayed on a single large sheet of material in various arrangements, and might be fabricated utilizing combinations of metal stamping, laser processing and material deposition techniques.

Material optimization covers experiments with higher efficiency piezoelectric materials such as antimony sulphoiodide (SbSI). These materials provide an "alloy" which is deposited on the substrate by sputtering or vacuum techniques.

The techniques described above lead to achieving a "single chip" tactor. This design provides a lower cost, smaller tactor by integrating the moving element and the support structure.

ARCOVA addressed a need to create a tactile interface for improving situational awareness for military pilots, SEAL divers, and NASA space flight crews. The problem was to create an innovative transducer (tactor) to convey information in a high workload environment through an under utilized sense-feel. ARCOVA has successfully designed, built, tested, and delivered to the Naval Aerospace Medical Research Laboratory prototype sets of tactors for human subject evaluation in overcoming spatial disorientation. Preferred embodiments of the tactors utilize lead zirconate titanate (PZT) material to generate vibration and buckling in a compact transducer combined with spatial summation to create a response even through clothing.

One preferred embodiment consists of a waist worn belt equipped with plural, for example six, tactors that may be readily reconfigured as well as the necessary electronic control and an accessory palm box.

The piezoelectric actuator developed by American Research Corporation of Virginia is useful in a wide range of commercial applications in such diverse areas as telecommunications, transportation systems, chemical analysis, machine design and medical instrumentation. The overall market for piezoelectric actuators may be as large as $2 Billion by 2002. The use of piezoelectric actuators in camera related applications may be as high as $300 Million by 2002. Markets also exist for piezoelectric actuators in telecommunication systems. Communications alert systems (beepers) may use covert vibration-based means of eliciting the attention of the message recipient. This market is in excess of 100 Million units per year, worldwide, with average costs for the piezoelectric element of $2 each. Additional market segments are to be found in fluid control (valves and controllers) and chemical sampling and analysis application areas. The piezoelectric actuator developed of the invention is applicable to open and close flow areas, thereby controlling pressure and flow rate for chemical sensors and chemical analysis instrumentation and to provide controlled rates of gas flow for medical, industrial and agricultural applications. These market segments are expected to be as large as $150 Million by 2002 with growth to over $3 Billion by 2010.

The most direct application of the present piezoelectric actuator is for tactile arrays for situational awareness. The 64 element vest-worn array to alert pilots of spatial disorientation and the position of enemy aircraft is one of the most important applications of the invention. Haptic displays may also find increased acceptance as a means of communicating data of exceptional significance to individuals engaged in complex tasks in stressful environments.

Tactile arrays are also useful for the U.S. Navy for providing data on the position of underwater divers during complex maneuvers and to alert Navy personnel on the approach of potential enemy forces. Tactile arrays may also be used in communicating information to individual personnel in all branches of the armed services, since the tactile information channel may be used in situations where visual and audio senses are preoccupied. The tactile communications channel does not require a shift in perceptual direction and can be covert for use in situations monitored by an enemy force.

While the invention has been described with reference to specific embodiments, modifications and variations of the invention may be constructed without departing from the scope of the invention, which is defined in the following claims.

We claim:

1. A tactor apparatus for delivering sensible information to skin of a user comprising a pre buckled plate, piezoelectric material on the plate, an electrical power source, an oscillator connected to the power source and the piezoelectric material being connected to the oscillator for vibrating the plate to a buckling mode of maximum displacement.

2. The tactor apparatus of claim 1, further comprising spaced anchors and wherein the plate is anchored at opposite ends.

3. The tactor apparatus of claim 2, wherein the plate is prestressed in compression between the ends.

4. The tactor apparatus of claim 1, wherein piezoelectric material is layered on the plate.

5. The tactor apparatus of claim 4, wherein the plate is sandwiched between two opposite layers of the piezoelectric material.

6. The tactor apparatus of claim 5, wherein the plate is metal.

7. The tactor apparatus of claim 5, wherein the oscillator has opposite outputs connected to the opposite layers of the piezoelectric material for vibrating together with the plate.

8. The tactor apparatus of claim 7, wherein the oscillator applies power to the opposite layers in bursts.

9. A tactor apparatus comprising a base, a pre buckled plate axially compressed in the major direction connected to the base, piezoelectric material on the plate, a power source, a control connected to the power source, an oscillator connected to the power source and connected to the piezoelectric material and vibrating the plate to resonance and maximum vibratory displacement.

10. The tactor apparatus of claim 9, wherein the base further comprises opposite anchors and the plate is pre-deflected and axially compressed between the anchors, wherein the plate is coated on opposite sides with opposite layers of the piezoelectric material, wherein the oscillator has opposite outputs which are connected respectively to the opposite layers and wherein the control has a timer for connecting the power source to the oscillator in short bursts.

11. The tactor apparatus of claim 9, wherein the oscillator applies current to the piezoelectric material in short bursts.

TABLE I

Fundamental Frequency as a Function of Vibration Mode m and Young's Modulus $E_{PZT}$ when Axial Compressive Force $N_x^0 = 0$, in Flat Plate and Equivalent Straight Beam.

|  | mode 1 | | mode 2 | | mode 3 | |
| --- | --- | --- | --- | --- | --- | --- |
|  | $E_{PZT}$ = 49 GPa | $E_{PZT}$ = 63 GPa | $E_{PZT}$ = 49 GPa | $E_{PZT}$ = 63 GPa | $E_{PZT}$ = 49 GPa | $E_{PZT}$ = 63 GPa |
| Flat Plate | 331 Hz | 370 Hz | 1326 Hz | 1480 Hz | 2984 Hz | 3330 Hz |
| Straight Beam | 430 Hz | 450 Hz | 1722 Hz | 1800 Hz | 3875 Hz | 4050 Hz |

12. The tactor apparatus of claim 9, further comprising a MYLAR layer covering the piezoelectric material for insulating the piezoelectric material.

13. A method of providing tactile perceivable information comprising mounting tactile bases and pre buckling and placing tactile communicator plates which are axially compressed in the major direction against a user, selectively driving the plates by supplying vibratory energy to the plates in short bursts and vibrating the plates in resonance and maximum displacement.

14. The method of claim 13, further comprising holding the communicator plates outside of clothing and Positioning the clothing between the communicator plates and a user's skin.

15. The method of claim 13, further comprising pre-deflecting the plates and axially compressing the plates before driving the plates.

16. The method of claim 15, wherein drawing the plates comprises supplying opposite current to opposite layers of the piezoelectric material on opposite sides of the plates and insulating the piezoelectric material layers with a dielectric film.

* * * * *